| (12) | United States Patent | (10) Patent No.: | US 8,890,115 B2 |
|---|---|---|---|
| | Sutter et al. | (45) Date of Patent: | Nov. 18, 2014 |

(54) STABLE AND METASTABLE NANOWIRES DISPLAYING LOCALLY CONTROLLABLE PROPERTIES

(75) Inventors: Eli Anguelova Sutter, Westhampton Beach, NY (US); Peter Werner Sutter, Westhampton Beach, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 115 days.

(21) Appl. No.: 13/526,239

(22) Filed: Jun. 18, 2012

(65) Prior Publication Data

US 2012/0270737 A1 Oct. 25, 2012

Related U.S. Application Data

(63) Continuation-in-part of application No. 12/683,054, filed on Jan. 6, 2010, now Pat. No. 8,389,387.

(60) Provisional application No. 61/142,710, filed on Jan. 6, 2009.

(51) Int. Cl.

| H01L 29/06 | (2006.01) |
|---|---|
| H01L 31/00 | (2006.01) |
| H01L 21/20 | (2006.01) |
| H01L 21/36 | (2006.01) |
| H01L 21/02 | (2006.01) |
| B82Y 30/00 | (2011.01) |
| B82Y 40/00 | (2011.01) |
| B82Y 20/00 | (2011.01) |
| B82Y 10/00 | (2011.01) |

(52) U.S. Cl.
CPC ........ *H01L 29/0665* (2013.01); *H01L 29/0669* (2013.01); *H01L 21/02653* (2013.01); *H01L 29/0673* (2013.01); *H01L 21/02645* (2013.01); *H01L 21/02521* (2013.01); *B82Y 30/00* (2013.01); *B82Y 40/00* (2013.01); *H01L 21/02532* (2013.01); *H01L 21/02609* (2013.01); *B82Y 20/00* (2013.01); *H01L 21/02603* (2013.01); *H01L 21/0262* (2013.01); *B82Y 10/00* (2013.01)
USPC ..... 257/14; 257/661; 257/E39.001; 257/E21.101; 257/E29.07; 438/478

(58) Field of Classification Search
USPC ............. 438/478; 257/14, 26, 661, E39.001, 257/E39.005, E29.069, E21.09, E21.101, 257/E29.07; 977/762, 888, 890
See application file for complete search history.

(56) References Cited

U.S. PATENT DOCUMENTS

| 5,332,910 A | * | 7/1994 | Haraguchi et al. ............... 257/13 |
|---|---|---|---|
| 7,714,317 B2 | * | 5/2010 | Sutter et al. ..................... 257/15 |

(Continued)

OTHER PUBLICATIONS

Sutter, Formation and stabilization of single-crystalline metastable AuGe phases in Ge nanowires, Nanotechnology 22(2011)295605, pp. 1-6.*

(Continued)

*Primary Examiner* — William F Kraig
*Assistant Examiner* — Latanya N Crawford
(74) *Attorney, Agent, or Firm* — Dorene M. Price; Lars O. Husebo

(57) ABSTRACT

Vapor-liquid-solid growth of nanowires is tailored to achieve complex one-dimensional material geometries using phase diagrams determined for nanoscale materials. Segmented one-dimensional nanowires having constant composition display locally variable electronic band structures that are determined by the diameter of the nanowires. The unique electrical and optical properties of the segmented nanowires are exploited to form electronic and optoelectronic devices. Using gold-germanium as a model system, in situ transmission electron microscopy establishes, for nanometer-sized Au—Ge alloy drops at the tips of Ge nanowires (NWs), the parts of the phase diagram that determine their temperature-dependent equilibrium composition. The nanoscale phase diagram is then used to determine the exchange of material between the NW and the drop. The phase diagram for the nanoscale drop deviates significantly from that of the bulk alloy.

16 Claims, 9 Drawing Sheets

(56) References Cited

U.S. PATENT DOCUMENTS

| | | | | |
|---|---|---|---|---|
| 7,838,368 | B2* | 11/2010 | Surdeanu et al. | 438/285 |
| 2001/0023986 | A1* | 9/2001 | Mancevski | 257/741 |
| 2006/0122596 | A1* | 6/2006 | Dubrow | 606/60 |
| 2007/0205792 | A1* | 9/2007 | Mouli et al. | 324/765 |
| 2008/0092938 | A1* | 4/2008 | Majumdar et al. | 136/200 |
| 2008/0266556 | A1* | 10/2008 | Kamins et al. | 356/301 |
| 2009/0257921 | A1* | 10/2009 | Sutter et al. | 422/100 |
| 2010/0035412 | A1* | 2/2010 | Samuelson et al. | 438/478 |
| 2010/0151661 | A1* | 6/2010 | Samuelson et al. | 438/478 |

OTHER PUBLICATIONS

Varadwaj, Phase-Controlled Growth of Metastable Fe5Si3 Nanowires by a Vapor transport Method, J. Am. Chem Soc. 2007, pp. 8594-8599.*

Agarwal, S., et al., "Phase Decomposition in Liquid-Quenched Eutectic Au—Ge Alloy," *Journal of Materials Science,* vol. 13, pp. 916-919, 1978.

Cavallotti, P., et al., "Phase Structure of Electrodeposited Alloys," *Electrochimica Acta,* vol. 50 pp. 4557 to 4565, 2005.

Elliott, R., et al., "The Au—Ge System (Gold—Germanium)," *Journal of Phase Equilibria,* vol. 1, pp. 51-54, 1980, (prior to vol. 12 (1991) this journal was published as *Bulletin of Alloy Phase Diagrams*).

Fujinaga, Y., et al., "Formation of an Intermediate Phase in Eutectic Au—Ge and Ag—Ge Systems Under High Pressure," *Journal of the Less-Common Metals,* vol. 170, pp. 277-286, 1991.

Jones, H., "Splat Cooling and Metastable Phases," *Reports on Progress in Physics,* vol. 36, pp. 1425 to 1497, 1973, with six pages containing figures 7,8,9,11,17, and 18.

Manaila, R., "Metastable Metallic Alloys," *Physica Status Solidi (A),* vol. 176, pp. 801-834, 1999.

Schülli, T., et al., "Substrate-Enhanced Supercooling in AuSi Eutectic Droplets," *Nature,* vol. 464, No. 22, pp. 1174-1177, 2010.

Sutter, E., et al., "Assembly of Ordered Carbon Shells on GaN Nanowires," *Applied Physics Letters* vol. 90, pp. 093118-1 to 093118-3, 2007.

Sutter, E., et al., "Formation and Stabilization of Single-Crystalline Metastable AuGe Phases in Ge Nanowires," *Nanotechnology,* vol. 22, pp. 1-6, 2011, and 3 pages of supporting information [online] [retrieved on Nov. 21, 2013] from: <URL: http://iopscience.iop.org/0957-4484/22/29/295605/.

* cited by examiner

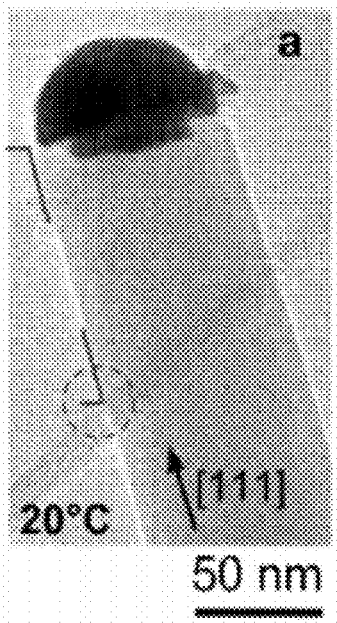
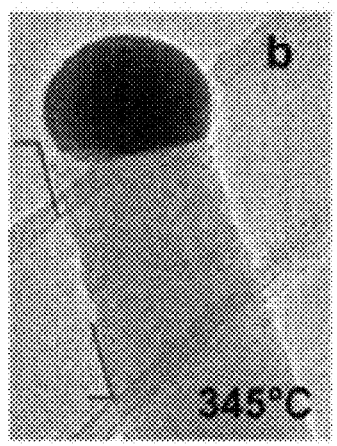
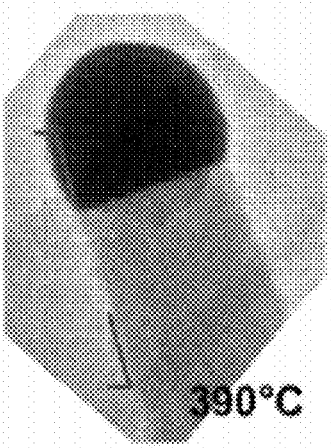
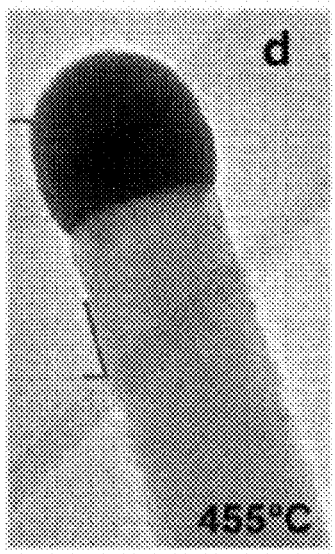
Fig. 1A   Fig. 1B   Fig. 1C
Fig. 1D   Fig. 1E Fig. 2A
Fig. 2B
Fig. 2C
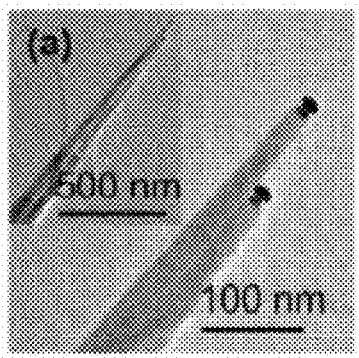
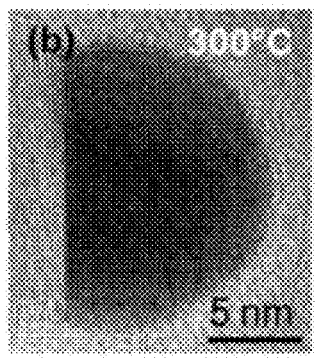
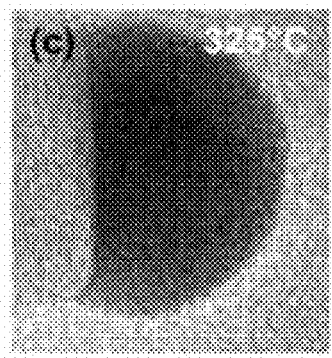
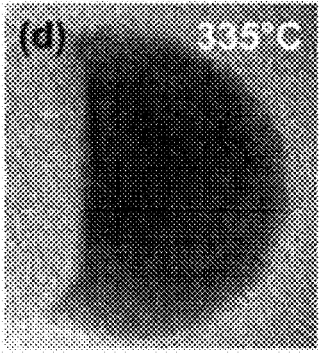
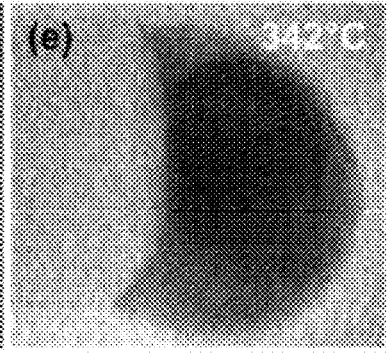
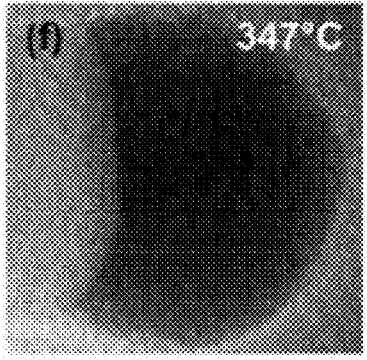
Fig. 2D
Fig. 2E
Fig. 2F

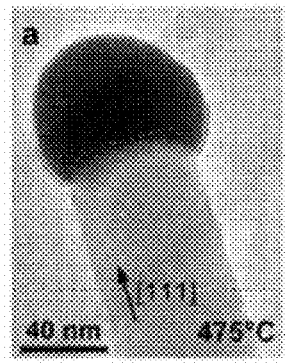   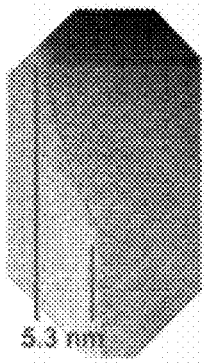
Fig. 6A    Fig. 6B    Fig. 6C    Fig. 6D
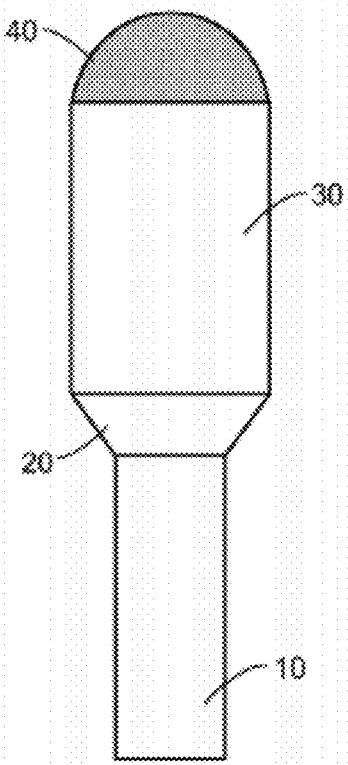
Fig. 7

STABLE AND METASTABLE NANOWIRES DISPLAYING LOCALLY CONTROLLABLE PROPERTIES

CROSS-REFERENCE TO A RELATED APPLICATION

This application is a Continuation-In-Part (CIP) of the U.S. patent application Ser. No. 12/683,054, which claims the priority benefit under 35 U.S.C. 119(e) of U.S. Provisional Application No. 61/142,710 filed on Jan. 6, 2009, the content of which is incorporated herein in its entirety.

STATEMENT OF GOVERNMENT RIGHTS

This invention was made with Government support under contract number DE-AC02-98CH10886, awarded by the U.S. Department of Energy. The Government has certain rights in the invention.

FIELD OF THE INVENTION

This invention relates generally to nanowire growth. In particular, the present invention relates to the synthesis of high-quality nanowires with site-specific dimensional control. This invention further relates to the utilization of such nanowires in characterization tools as well as in electronic and optical devices.

BACKGROUND

The development of tools capable of analyzing, controlling, and forming materials on the nanoscale has led to an interest in creating new structures and devices at these dimensions. This ability to control matter on an atomic and molecular scale is the basis for the rapidly developing field of nanotechnology. As the size of a system continually decreases, its physical, optical, and electrical properties may differ significantly from, and even be superior to, those observed at the macroscale. These differences occur primarily due to quantum size effects and a significant increase in the surface-to-volume ratio as a consequence of the reduction to nanoscale dimensions. Moreover, the properties of such materials may differ significantly based on whether the material exists in an equilibrium state or a metastable state. Indeed, metastable solids have long been used in technology to access a much wider range of materials properties than those of the limited set of equilibrium phases. These changes strongly influence a number of materials properties which include the electronic, optical, mechanical, thermal, and chemical properties of the material itself.

From among the various nanomaterials that have emerged, zero- and one-dimensional nanostructures have attracted significant interest due to the potential for developing materials and devices with unique electrical and optical properties. The metastablity of such materials has also attracted significant interest due to the potential for harnessing specific functional properties of metastable phases. Potential applications include quantum devices utilizing carrier confinement, photovoltaic cells, sensors, optical switches, electronic devices such as field-effect transistors (FETs), p-n junctions, and bipolar junction transistors, and for metastable phases, potential for superconductivity. One of the means to the realization of practical applications utilizing these materials is the ability to form nanostructures with controlled dimensions, structures, phases and compositions. Such control would enable tailoring of the electrical, optical, and mechanical properties to a particular application. Another aspect is the ability to form these nanostructures on a large scale at minimal cost.

The synthesis of zero-dimensional (0-D) nanostructures or quantum dots has been well-studied with a plurality of methods having been developed to form 0-D nanostructures in designated locations with well-controlled dimensions using a variety of materials. One-D nanostructures are often defined as structures with lateral dimensions falling within the range of 1 nm to 1 µm, but more usually to those in the range of 1 nm to 100 nm and longitudinal dimensions extending essentially indefinitely. Thus, while 0-D structures are generally discrete particles which are dimensionally symmetric, the formation of 1-D nanostructures requires that growth be constrained in two dimensions, yet extended along a third.

Top-down approaches which have been used to fabricate a variety of 1-D nanostructures from different materials include lithographic techniques such as electron-beam or focused-ion-beam etching, scanning probe patterning, and X-ray or extreme ultraviolet lithography. However, these techniques are not feasible for efficient large-scale manufacturing of 1-D nanostructures at low cost. Consequently significant effort has been focused on developing alternative methods to efficiently produce a large number of 1-D nanostructures from a wide range of materials. A majority of these have focused on bottom-up approaches in which 1-D growth strategies have been formulated based upon chemical synthesis routes. A review of these strategies is provided, for example, by Y. Xia in "One-Dimensional Nanostructures: Synthesis, Characterization, and Applications," *Adv. Mater.* 15, 353 (2003) the entire contents of which is incorporated by reference as if fully set forth in this specification.

Growth strategies which have been employed to form 1-D structures include, for example:
a) exploiting the anisotropic crystal structure of select materials;
b) using a liquid-solid interface to direct growth of a crystal;
c) forming a 1-D template to constrain growth to a specific direction;
d) controlling supersaturation of the gas phase to modify the growth mode;
e) use of capping reagents to kinetically control the growth rates on different crystal facets;
f) self-assembly of multiple 0-D nanostructures; and
g) direct size reduction of 1-D microstructures.

From among the various approaches followed, one of the most extensively investigated approaches involves the vapor-phase synthesis of nano structures such as 1-D whiskers, nanorods, and nanowires (NW).

Vapor-phase synthesis primarily involves manipulating the degree of supersaturation of the gas phase to control the growth mode. One approach, termed vapor-liquid-solid (VLS) growth, has been used to successfully produce high-quality single-crystal NWs in significant quantities. The VLS process was used by Wagner and coworkers in the 1960's to form Si "whiskers" as described in "Vapor-Liquid-Solid Mechanism of Single Crystal Growth," *Appl. Phys. Lett.* 4, 89 (1964), which is incorporated by reference herein in its entirety. Central to the VLS process is the use of a catalyst comprising a metal or metal alloy to direct NW growth; in the case of Wagner's Si whiskers the catalyst was a gold-silicon (Au—Si) alloy. The catalyst is initially dispersed across the surface of a substrate as suitably-sized nanoparticles which transform to the liquid alloy phase upon heating and supplying of semiconductor material. The liquid alloy nanoparticles absorb atoms from the vapor phase, facilitating the nucleation of crystal seeds at the liquid-substrate interface from which NW growth can occur. The material constituting the growing NW and the nanoparticle form a liquid-phase binary alloy drop whose interface with the growing wire represents the NW growth front. Under steady-state growth conditions, adsorption on the drop surface maintains a concentration gradient of the NW component of the liquid binary alloy, which is counteracted by a diffusion current through the drop. This liquid phase transport, in turn, causes a small supersaturation driving the incorporation of new material at the drop-NW interface to continually extend the wire. This growth process is described, for example, by E. I. Givargizov in "Fundamental Aspects of VLS Growth," *J. Cryst. Growth* 31, 20 (1975) which is incorporated by reference in its entirety as if fully set forth in this specification. Givargizov used Pd, Ni, and Pt, in addition to Au, as liquid-forming agents (growth catalysts) for Si.

The VLS process has now been used to synthesize NWs from a wide variety of inorganic materials including, for example, group IV (Si and Ge), IV-IV (SiC), III-V (GaN, GaAs, GaP, InP, and InAs), II-VI (ZnS, ZnSe, and CdSe), and IV-VI (PbSe, PbS) semiconductors as well as oxides such as ZnO, MgO, and $SiO_2$. This has been demonstrated, for example, by X. Duan, et al. in "General Synthesis of Compound Semiconductor Nanowires," *Adv. Mater.* 4, 298 (2000) and "InP Nanowires as Building Blocks for Nanoscale Electronic and Optoelectronic Devices," *Nature* 409, 66 (2001), as well as by T. I. Kamins, et al. in "Growth and Structure of Chemically Vapor Deposited Ge Nanowires on Si Substrates," *Nano Lett.* 4, 503 (2004) ("Kamins 2004"), each of which is incorporated by reference in its entirety as if fully set forth in this specification. Note that the VLS growth of compounds such as GaAs and GaP need not require the use of an exotic catalyst; they may instead be grown via the formation of a liquid in which one or the other element is enriched compared to the equilibrium solid composition.

Despite its widespread use, key aspects of the VLS growth process remain poorly understood. Consequently, little is known about how to control nanowire dimensions during growth primarily due to the fact that, in contrast to studies on conventional thin film deposition, measurements with nanometer spatial resolution are needed to analyze the mechanisms of NW growth. While progress has been made, there remains a need to develop methods for fabricating a large number of high-quality nanowires with well-controlled dimensions, chemical compositions, surface morphologies, and nanostructures. It is therefore necessary to formulate strategies to control not only the nucleation, growth mode, average diameter, and length of individual nanowires, but also the local site-specific diameter during growth itself.

SUMMARY

In view of the above-described problems, needs, and goals, some present embodiments provide a method of controlling the local position-dependent dimensions of a nanowire (NW) during vapor-liquid-solid (VLS) growth. Some present embodiments produce a metastable NW.

In this embodiment, the NW is grown, a liquid drop is formed at the growing tip of the NW and the material crystallizes out of the drop. The metastable solid phases form by the stabilization of the liquid phase and crystallization of an extremely supercooled melt. In another embodiment, the process involves a size-dependent depression of the alloy liquidus at the nanoscale. During slow cooling, these liquid alloy drops show pronounced departures from equilibrium, i.e., a frustrated phase separation, and ultimately crystallize as single-crystalline segments of metastable NW, such as γ-AuGe.

Some other embodiments produce a NW with at least two sections along the length of the NW wherein the diameter changes abruptly between each section. In one embodiment, control of nanowire dimensions is accomplished by increasing the temperature. Increasing the temperature results in an increase in the solubility limit of a drop situated at a growth interface with the NW. This drives further incorporation of material either from the precursor or from the NW into the drop, thereby enlarging the drop. The enlarged drop eventually attains a size larger than the diameter of the NW.

In this embodiment, as the NW grows and the material crystallizes out of the drop, the nanowire expands radially outward from the center of the nanowire along the circumference of the enlarged drop, thereby increasing the diameter of the nanowire. In another embodiment the growth is stopped after the drop is enlarged and the system is annealed for a certain amount of time. NW growth may then be resumed by reintroducing the growth precursor. The change in nanowire diameter is abrupt on an atomic scale, occurring over a few lattice spacings of the material along the growth direction, yet maintains continuity of the crystal structure across the entire length of the wire.

In some embodiments, the diameter of the drop is controlled by the composition of a precursor material.

In another embodiment, a nanowire comprising a plurality of sections, each of which has a different diameter is formed by repeating the method, as described above, a plurality of times. In yet another embodiment, a nanowire comprising a plurality of sections containing stable and metastable phases is formed by repeating the method, as described above, a plurality of times. In still another embodiment, a nanowire comprising a plurality of sections each of which has a different diameter and/or containing stable and metastable phases is formed. In this manner, nanowires with complex geometries which exploit quantum size effects on different length scales within the same nanowire and/or multiple phases which exploit functional properties, such as the superconductivity, may be formed. The diameter of the nanowire ranges between 1 and 100 nm, with the length along the nanowire axis being a predetermined value. The diameter of a NW section may be larger or smaller than that of a preceding or subsequent section. Each section may be stable, metastable or both.

In some embodiments, a nanowire of uniform composition and having a plurality of segments is provided, the bandgap of the nanowire differing between segments. In some embodiments, the dopant concentration and/or type is changed abruptly between segments. This may be accomplished by changing the amount and/or identity of a dopant precursor in the gas phase. In some embodiments only the dopant type and/or concentration changes between segments of the NW; in others both the doping and diameter may change.

In yet another embodiment a nanowire with two or more sections, each with differing diameters, phase states, or both, is incorporated into an electronic device. The electronic device may be, for example, a sensor, photoelectronic device, transistor, electronic switch, or for impedance-matching of two or more delay lines.

These and other aspects of the present invention will become more apparent from the following description and illustrative embodiments which are described in detail with reference to the accompanying drawings. Similar elements in each figure are designated by like reference numbers and, hence, subsequent detailed descriptions thereof may be omitted for brevity.

BRIEF DESCRIPTION OF THE DRAWINGS

FIGS. 1A-1E are transmission electron microscopy (TEM) images showing a Au—Ge alloy nanoparticle at the tip of a Ge nanowire (NW), during in situ annealing at temperatures between room temperature and 475° C.

FIGS. 2A-2F show a sequence of TEM images which illustrate the process of melting of a Au—Ge nanoparticle during in situ annealing.

FIGS. 6A-6D are a sequence of TEM images showing a liquid Au—Ge alloy drop at the tip of a Ge NW formed according to the present invention at different temperatures during cooling from 475° C. to solidification.

FIG. 7 is a schematic illustration of the cross-section of an exemplary NW formed according to the present invention whose diameter has been locally modified by manipulation of Ge supersaturation in the Au—Ge drop.

FIG. 10A-10E are a sequence of TEM images showing melting, liquid-state evolution, and crystallization of the Au—Ge alloy at the tip of a 32 nm Ge NW during in-situ annealing up to 575° C., followed by cooling to room temperature. In the images, 'L' and 'S' denote liquid and solid states, respectively.

DETAILED DESCRIPTION

Figure 3:
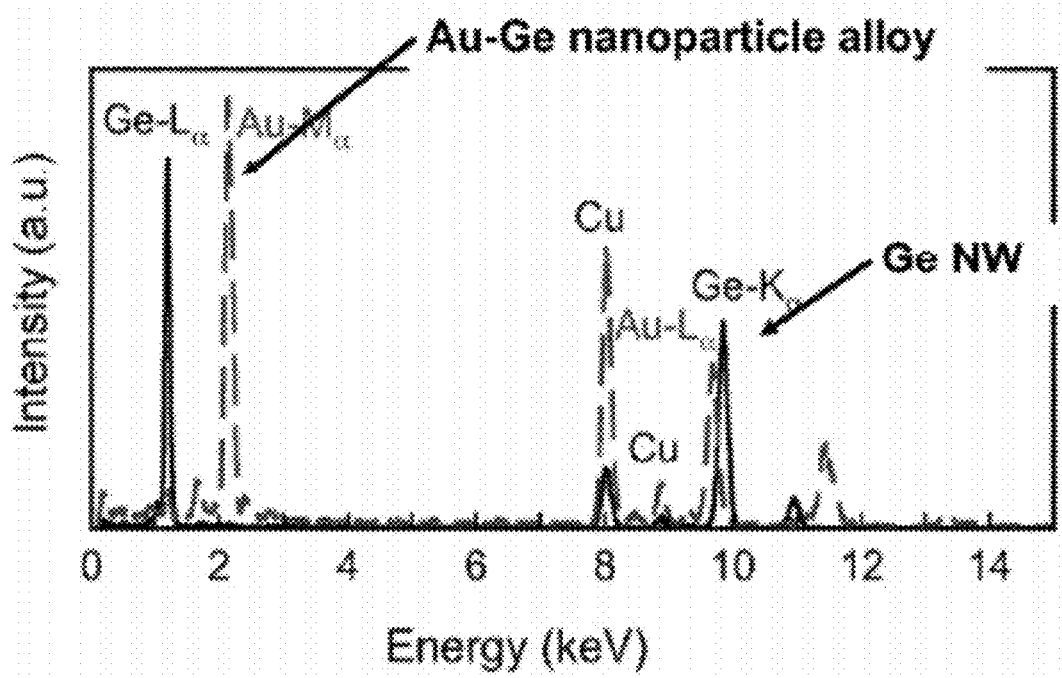
FIG. 3 shows room-temperature energy dispersive spectroscopy (EDS) data obtained from the Ge NW and a Au—Ge nanoparticle at the tip of a Ge NW.

In the interest of clarity, in describing the present invention, the following terms and acronyms are defined as provided below

DEFINITIONS

Alloy: A partial or complete solid or liquid solution of two or more elements.

Bottom-Up Approach: A growth or manufacturing method wherein smaller components (usually on the atomic or molecular scale) are built up into more complex assemblies. This approach uses, for example, the chemical properties of molecules to cause them to self-assemble.

Eutectic Composition: In a binary alloy system, the composition that solidifies at the lowest temperature of any composition in the system.

Eutectic Reaction: A reaction in which, upon cooling below a eutectic temperature, a liquid phase transforms isothermally and reversibly into two intimately mixed solid phases.

Eutectic Temperature: In a binary alloy system, the lowest temperature at which any composition of the system solidifies.

ex situ: The opposite of in situ. This term is used, in the context of nanowire growth, to mean that a process or analysis is performed outside the growth or analytical chamber, after deposition is at least partially complete.

in situ: Latin for "in the place." Within the context of nanowire growth or analysis this means that a process or analysis is performed within the growth or analytical chamber. Measurements performed within the TEM before, during, or after annealing and without breaking vacuum are termed in situ.

β-phase: Generally, a metastable phase of AuGe alloy having the hcp crystal structure and specifically as described for example in para. [0077].

γ-phase: Generally, a metastable phase of AuGe alloy that is a superconductor in the bulk, and specifically as described for example in para. [0077].

Liquidus Line: In a binary phase diagram, the line or boundary separating liquid and liquid+solid phase regions. For a given alloy composition, the liquidus temperature is the temperature at which a solid phase first forms under conditions of equilibrium cooling.

Metastable Solid: Being possessed of a local minimum energy. Metastable phases may persist even in contact with stable phases (those possessing a global minimum energy) if the energy or time required for transition to the stable state is not available to the system. An example is diamond, a long-lived metastable phase of carbon at standard temperature and pressure.

Nanoparticle: Objects which are sized between 1 and 100 nm in all three dimensions.

Nanowire: A wire-like object having a diameter in the nanometer size range. The lateral size is generally constrained to within 1 to 100 nm in diameter whereas the longitudinal size is unconstrained.

Phase Diagram: A type of chart showing the relationship between environmental constraints such as temperature or pressure with the composition and regions of phase stability in a material. This is ordinarily shown under conditions of thermodynamic equilibrium.

Top-Down Approach: A growth or manufacturing method in which externally controlled tools are used to configure materials into the desired shape and order. This approach uses microfabrication techniques such as photolithography or inkjet printing.

Acronyms

Au: Gold
CVD: Chemical Vapor Deposition
EDS: Energy Dispersive X-ray Spectroscopy
DP: Electron Diffraction Pattern
FET: Field-Effect Transistor
Ge: Germanium
HR-TEM: High-Resolution TEM
NW: Nanowire
TEM: Transmission Electron Microscopy
UHV: Ultrahigh Vacuum
VLS: Vapor-Liquid-Solid
VSS: Vapor-Solid-Solid The present NWs are based on the discovery that the phase diagram of nanoscale alloy drops differs from the corresponding bulk phase diagram. The properties of the alloy drop at or close to thermodynamic equilibrium with the adjacent NW, represented by the phase diagram of the binary alloy, govern important aspects of VLS NW growth. A key parameter is the equilibrium composition of the binary alloy drop formed from the nanoparticle and the NW material as determined by the liquidus line in the nanoscale binary phase diagram. Changing the temperature of the drop results in a spontaneous adjustment to a new equilibrium composition by exchange of material with the adjacent solid NW. This leads to a well-defined adjustment of the drop size which, in turn, defines the diameter of the growing NW.

The drop size defines the diameter of the growing NW, a characteristic that governs, via quantum confinement, the electronic and optical properties of the wire. The one-to-one relationship between drop size and wire diameter is used to control the overall diameter of the NW in general, and in some present embodiments to control the local position-dependent diameter during growth. Constricted or dilated NW sections with a locally increased or decreased band gap may be produced along the length of a NW by adjusting the temperature to induce changes in the drop size. Thus, a major step toward forming such new wire geometries and attaining increased control over VLS growth lies in a determination of the nanoscale phase diagram of the binary alloy drop for the relevant temperature range.

I. Vapor-Liquid-Solid Growth

The ability to control nanowire dimensions on the local scale was discovered while analyzing nanostructural changes induced by annealing germanium (Ge) nanowires formed by VLS growth with gold (Au) nanoparticles. It is to be understood, however, that the use of the Ge—Au material system as described in this specification is merely exemplary, being described in detail to illustrate the principles of the present NWs. Control of the nanowire size by temperature-induced changes in the solubility of the alloy drop may be achieved with any material system in which nanowires may be grown by the VLS method. This includes group IV, III-V, and II-VI semiconductors, as well as a number of oxides forming the material of the nanowire in combination with the appropriate metal or metal alloy as the nanoparticle catalyst. It is to be understood that for the non-elemental NW compositions the alloy drop may comprise a binary, ternary, quaternary, or higher-degree alloy. In the case of line compounds of well-defined stoichiometry, such as the III-V and II-VI semiconductors, the alloy drop may be "pseudo-binary," with the catalyst material in equilibrium with the line compound, such as GaAs or CdS. When the catalyst-NW system is not strictly binary, "eutectic" should be understood to include "eutectoid."

The growth of Ge NWs by a VLS process with Au as the catalyst nanoparticle was done according to synthesis routes previously described, for example, by E. Sutter et al. in "Selective Growth of Ge Nanowires by Low-Temperature Thermal Evaporation", *Nanotechnol.* 19, 435607 (2008); Kamins 2004; Y. Wu, et al. in "Direct Observation of Vapor-Liquid-Solid Nanowire Growth," *J. Am. Chem. Soc.* 123, 3165 (2001); and X. H. Sun, et al. in "Ge Nanowires: Synthesis, Morphology, and Local Structural Studies," *Nanotechnol.* 17, 2925 (2006) ("Sun 2006"), each of which, along with the references cited therein, is incorporated by reference in its entirety as if fully set forth in this specification. Post-growth the synthesized NWs are dispersed on amorphous carbon films supported by standard copper grids for variable temperature transmission electron microscopy (TEM) investigations.

II. Nanostructure Characterization (Stable Phase)

TEM and high-resolution TEM (HR-TEM) were used to observe, in real time, the behavior of the Au—Ge alloy drops at the tips of the Ge NWs while annealing over the temperature range from room temperature (RT) to 500° C. Variable temperature in situ TEM analyses were carried out in a JEOL JEM 3000F field emission TEM equipped with a Gatan 652 high-temperature sample holder. The TEM is capable of attaining temperatures ranging from RT to 500° C. at pressures below $1.5 \times 10^{-7}$ Torr. The electron irradiation intensity was maintained below 2 A/cm$^2$ to minimize uncontrolled electron-beam induced structural changes.

Such in situ observations at temperatures typical for NW growth are a powerful approach to quantifying equilibrium properties of the NW growth front as well as the NW growth kinetics. In situ TEM analyses can also be used to explore conditions suitable for the synthesis of complex NW geometries and hetero structures. The results reveal a pronounced temperature-dependent exchange of Ge between the NW and the Au—Ge drop in which the wire acts as an efficient source or sink of Ge as the drop adjusts its composition to achieve its equilibrium Ge content. Although these experiments do not incorporate a growth flux or the small (~2%) supersaturation that drives actual NW growth, they do allow quantitative determination of important parts of the phase diagram of nanometer-sized Au—Ge VLS seed drops.

A. Nanoparticle Alloy Phase Transitions

FIGS. 1A-1E are bright-field TEM images of a typical Ge NW segment located close to the tip which follow the evolution of the nanoparticle and its interface with the wire during in situ heating from room temperature to 475° C. The electron beam was aligned with the [211] direction of the nanowire. These NWs exhibit a slight taper (see, e.g., FIG. 2A) from the base to the Au-rich alloy nanoparticle at the tip which is distinguished by its darker contrast. Other NWs do not exhibit a taper, but give the same experimental results. The NWs have mono crystalline cores, are aligned with the [111] direction, and are initially terminated by a thin oxide layer formed in the air during transfer from the growth chamber. Initial heating from room temperature (e.g., FIGS. 1A and 2A) to 300° C., where the particle is still solid, causes the desorption of the native oxide from the Ge surface. This can be seen from a comparison of FIGS. 1A and 1B, which respectively show the presence and absence of a thin oxide layer surrounding the Ge NW core. The formation and desorption of this oxide layer has been analyzed in detail by E. Sutter, et al. in "Au-Induced Encapsulation of Ge Nanowires in Protective Carbon Shells," *Adv. Mater.* 18, 2583 (2006), which is incorporated by reference in its entirety as if fully set forth in this specification.

Melting of the Au—Ge alloy nanoparticle was analyzed as the temperature was increased from room temperature to the bulk eutectic temperature ($T_E$=368° C.) of the Au—Ge alloy. Representative images illustrating the melting process are shown in FIGS. 2A-2F. A bright-field TEM image of the structure and morphology of Ge NWs at room temperature is shown in FIG. 2A; this image was obtained prior to in situ annealing and is representative of the as-grown starting material of the present NWs. The inset of FIG. 2A shows a low-magnification overview of two wires dispersed on the underlying amorphous carbon support. The wires have diameters between 10 nm and 70 nm. The tapering effect is irrelevant to the observed phenomena; untapered NWs have been used in similar experiments with identical results. FIG. 2B is a high-resolution image obtained close to the NW tip which shows lattice fringes with separation of ~0.33 nm along a direction parallel to the NW axis. This is consistent with the spacing of (111) planes in bulk Ge. Within the Au—Ge alloy, lattice fringes with a separation of 0.21 nm are resolved, close to the lattice spacing of (111) planes in Au. At room temperature the alloy particle is not a homogeneous hemisphere but appears more irregular, likely as a result of the Au/Ge phase separation during cooling of the NWs after synthesis.

Energy dispersive X-ray spectra (EDS) from the nanowire and the nanoparticle were collected in the TEM at room temperature and the results are shown in FIG. 3, with the Ge spectrum shown by the solid line and the Au spectrum by the dashed line. The composition of the solid Au—Ge alloy was quantified from the EDS spectra using the integrated peak intensities (Ge—K, Au-L) and library element standards provided by the Thermo NORAN Vantage software package. The Cu peaks in both spectra in FIG. 3 arise due to the underlying Cu grid used to support the sample in the TEM. The EDS spectra show that the NW consists almost entirely of Ge (<1 at. % Au) while the Au nanoparticle contains very small amounts of Ge, less than 4 at. %, in agreement with similar observations reported by Sun, et al. (Sun 2006).

During in situ annealing, re-alloying of Au—Ge in the nanoparticle produces a hemispherical shape. FIG. 2B shows that at 300° C. both the Ge NW and the Au—Ge alloy are crystalline. The interface between them is sharp and flat but shows no epitaxial relationship. With further temperature increase, the Au—Ge alloy begins to pre-melt well below the bulk eutectic temperature. Pre-melting is accompanied by pronounced changes at the interface between the solid Ge NW and the Au—Ge alloy. At 325° C. a small amount of molten alloy is observed at the intersection between the {111} NW-tip interface and the surface (FIG. 2C). The molten area spreads as Ge from the NW is consumed. The melting front penetrates the NW until a {113} facet (a major stable facet of Ge in vacuum) is attained as shown by FIG. 2D. Simultaneously a liquid shell forms over the entire surface of the Au—Ge alloy (FIG. 2E), i.e., the alloy undergoes classical surface melting preceding the melting of the interior. FIG. 2F shows that the interior of this particular drop melted completely at 347° C.

The interface between the Ge NW and the liquid Au—Ge alloy drop is no longer a simple {111} facet (as in the solid state, FIG. 2B) but consists of segments of {111} and {113} facets (FIG. 2F). When the entire Au—Ge tip finally melts, a large amount of Ge is dissolved into the drop from the adjacent Ge NW, which is reflected by an abrupt increase of the volume of the Au—Ge drop. Measurements of the drop volume before and after this Ge enrichment give a final Ge content at the melting temperature of about 30 at. %. This is close to the eutectic Ge concentration of a bulk Au—Ge alloy if we assume that the initial NW tip after VLS synthesis consists mainly of Au. The eutectic composition in Au—Ge binary alloys is 28 at. % Ge as determined by B. Predel in Phase Equilibria, Crystallographic and Thermodynamic Data of Binary Alloys-Electronic Materials and Semiconductors, Landoll-Bornstein, Group IV: *Physical Chemistry*, Vol. 5a, Ed. O. Madelung (Springer-Verlag, Berlin 1991), Ch. "Au—Ge" pp. 1-4) which is incorporated by reference as if fully set forth in this specification.

Final melting of the Au—Ge nanoparticles as the alloy achieves the (eutectic) composition with the lowest melting point by dissolving Ge from the NW is generally observed at a eutectic temperature $T_E$=368° C. The volume change upon melting is accompanied by a simultaneous recession of the alloy-NW interface as the alloy absorbs the Ge required to reach the eutectic composition. A further increase of the temperature to 475° C. (>>$T_E$) is accompanied by a continuous increase of the volume of the now-liquid alloy drop. Again, the interface between the alloy and the adjacent solid Ge NW draws back towards the base of the NW as Ge is incorporated into the drop. Between room temperature and 475° C. the drop/NW interface recedes by ~25-30 nm and transforms from a planar Ge (111) facet to a multifaceted interface composed of {113} and {111} segments. This is illustrated by FIGS. 1B-1E which show that increasing the sample temperature, $T_S$, from 345° C. to 475° C. produces a gradual increase in the volume of the drop with a concomitant recession of the drop-NW interface. The marker in FIGS. 1A-1E delineates the surface of the Ge NW and provides a reference for the $T_S$-dependent location of the interface.

B. Nanoscale Phase Diagram

Measurements of the drop volume were used to quantify the alloy composition as a function of temperature. The Ge (atomic) content $N_{Ge}$ was calculated from the volume of the eutectic drop V(T) using $$N_{Ge} = \frac{V(T) - N_{Au}v_{Au}}{v_{Ge}}$$

where $N_{Au}$ is the (constant) number of Au atoms in the drop and $v_{Au}$, $v_{Ge}$ denote the atomic volumes of the alloy components as determined from the densities of liquid Au ($\rho_{Au}=17.4\times10^3$ kg/m$^3$) and Ge($\mu_{Ge}=5.49\times10^3$ kg/m$^3$), respectively. The calculations are performed under the assumption that the initial, solid particle at room temperature consists of pure Au (i.e., that all Ge is expelled by phase separation upon solidification). As previously noted, in situ EDS results show minimal amounts of Ge in the particle, evaluated to be less than 4 at. %. With this assumption, the composition of the liquid drop at the melting temperature is found to be very close (within ±2 at. %) to the bulk eutectic composition (28 at. % Ge).

Figure 4:
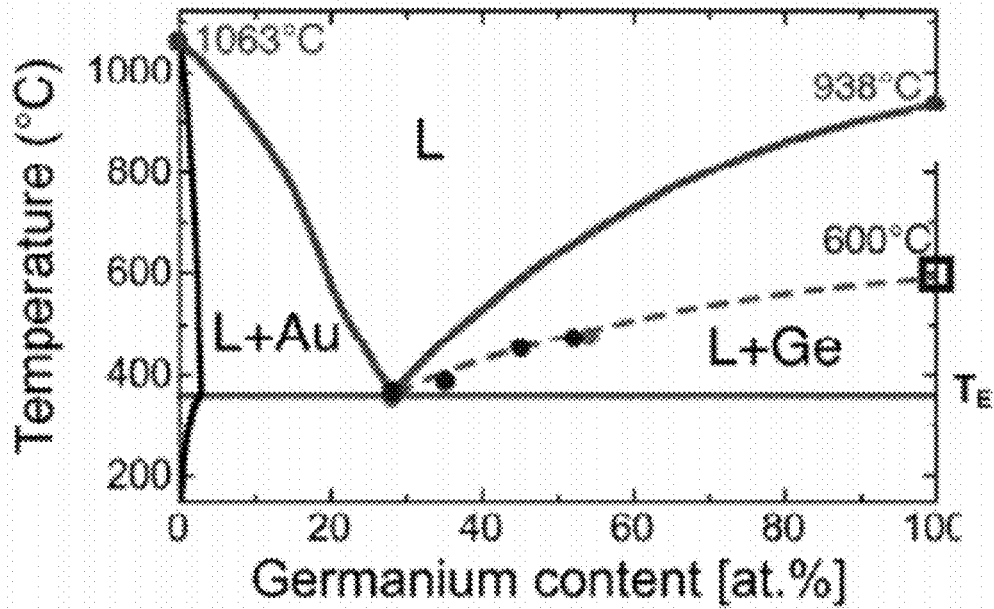
FIG. 4 is a Au—Ge binary alloy phase diagram with data on the temperature-dependent Ge content of two Au—Ge alloy nanoparticles at the tip of Ge NWs with radii of 10 and 30 nm which have been formed in accordance with the present invention.

At equilibrium, the atomic concentration of Ge in the alloy, $x(T)=N_{Ge}/(N_{Au}+N_{Ge})$, traces the liquidus of the nanoscale Au—Ge drop during VLS growth. A phase diagram for bulk Au—Ge binary alloys, which also includes the measured liquidus (dashed line) for NWs with diameters D of 60 nm (shown in FIG. 1) and 20 nm, is reproduced in FIG. 4. Experimental points are depicted as filled circles (●), while the melting temperature for a pure Ge nanoparticle calculated as explained below is depicted as an open square (□). In FIG. 4, L represents the Au+Ge liquid phase. While the eutectic temperatures ($T_E$) are very close to $T_E,\infty$ of the bulk alloy, the nanometer-sized drops have substantially higher Ge content than a bulk Au—Ge alloy at temperatures $T_S > T_E$. That is, for a given temperature above $T_E$, the liquidus line for the Au—Ge nanoparticle alloy is shifted to higher Ge concentrations. This means that the liquidus temperature for a given Ge concentration is depressed, resulting in a VLS seed drop with a Ge content and volume which is much larger than predicted by the bulk phase diagram. As the Ge content is continually increased, the lowered liquidus tends toward a significantly reduced melting temperature for a pure Ge nanoparticle. Large melting point depressions are often observed for nanoparticles as demonstrated, for example, by A. N. Goldstein, et al. in "Melting in Semiconductor Nanocrystals," *Science*, 256, 1425 (1992), which is incorporated by reference in its entirety as if fully set forth in this specification.

The size dependence of the melting temperature can be estimated using the well-established dependence $T_m = T_m, \infty[1-\alpha/d]$, for spherical particles with diameter d, where $T_m,\infty$ denotes the bulk melting temperature and .alpha. depends on the surface to volume ratio, and on the surface tensions of the liquid and solid as shown, for example, by M. Wautelet in "Estimation of the Variation of the Melting Temperature With the Size of Small Particles on the Basis of the Surface-Phonon Instability," *J. Phys. D Appl. Phys.* 24, 343 (1991), which is incorporated by reference in its entirety as if fully set forth in this specification. For Ge, the predicted melting temperatures fall between 530° C. and 800° C. for particles with diameter between 20 nm and 60 nm. Extrapolating the experimental points for the Ge NW liquidus, using the functional form of the bulk liquidus, to the melting temperature of a pure. Ge nanoparticle gives $T_m \approx 600°$ C., equivalent to the predicted $T_m$ of a nanoparticle with a 26-nm diameter and in excellent agreement with the observed melting temperature of a NW with a 20-nm diameter as determined by Y. Wu, et al. in "Melting and Welding of Semiconductor Nanowires in Nanotubes," *Adv. Mater.* 13, 520 (2001), which is incorporated by reference in its entirety as if fully set forth in this specification.

An immediate consequence of the liquidus suppression in the nanoscale Au—Ge phase diagram-important for VLS synthesis of Ge NWs-follows from the fact that the size of the alloy drop determines the wire diameter. While the bulk phase diagram predicts a negligible increase in drop size between $T_E$ and 500° C., the actual Au—Ge nanoparticle phase diagram implies a substantial size range in which the drop (and, hence, the wire) diameter may be adjusted by judicious changes in temperature. Formation of a nanoscale phase diagram has been described in detail by the inventors, E. Sutter, et al. in "Phase Diagram of Nanoscale Alloy Particles Used for Vapor-Liquid-Solid Growth of Semiconductor Nanowires," *Nano. Lett.* 8, 411 (2008), which, along with the references cited therein, is incorporated by reference in its entirety as if fully set forth in this specification.

C. Localized Control of Nanowire Dimensions

Figure 5:
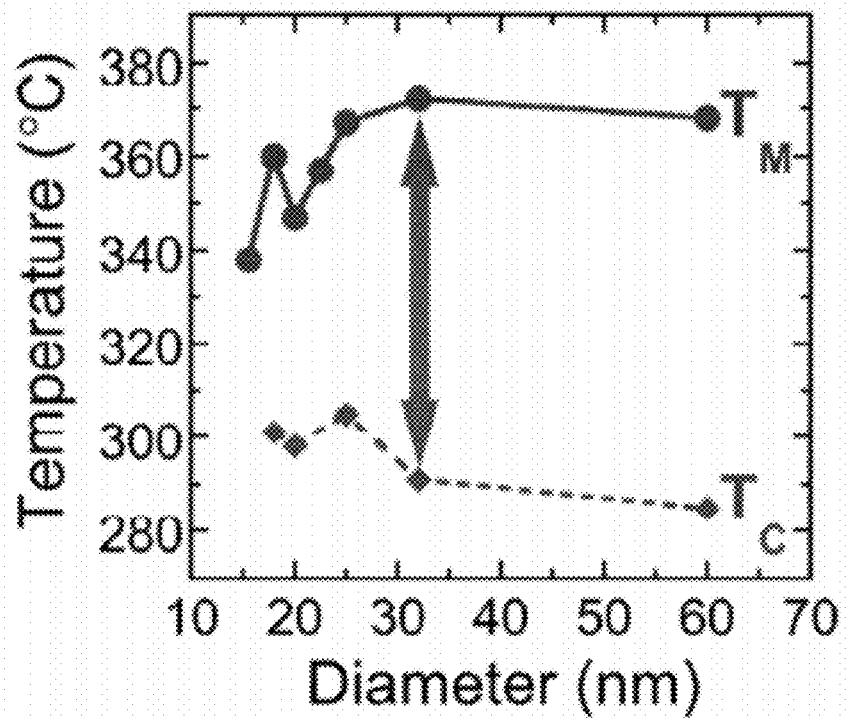
FIG. 5 shows the dependence of the melting and crystallization temperature of Au—Ge nanoparticles at the tip of Ge NWs as a function of the NW diameter.

Controlled expansion of the NW diameter by tuning the size of the Au—Ge drop was observed by high-temperature in situ TEM. In these experiments a large hysteresis between melting and crystallization temperatures (i.e., supercooling) of the alloy drops terminating the Au—Ge NWs is used. This is plotted in FIG. 5 which shows the dependence of the melting $T_M$ and crystallization $T_C$ temperatures on the size of the Au—Ge nanoparticle. For very small diameters, the melting point is depressed by about 20° C. while the observed crystallization temperature increases slightly. This indicates the possibility of a surface-induced crystallization process similar to that observed for free-standing Au—Ge drops as reported by P. Sutter, et al. in "Dispensing and Surface-Induced Crystallization of Zeptoliter Liquid Metal-Alloy Drops," *Nat. Mater.* 6, 363 (2007), which is incorporated by reference in its entirety as if set forth in this specification.

The difference between melting and crystallization provides a temperature window below $T_E$ in which a cooling drop remains liquid. The supercooled drop maintains its equilibrium composition by expelling Ge which then becomes incorporated in the Ge NW. This behavior allows the effective probing of the growth of a short NW section without driving the system out of equilibrium by an actual Ge flux onto the external surface of the alloy drop. The material is precipitated out of the drop by decreasing the temperature below Tc. As previously described with reference to FIGS. 1 and 2, annealing to $T_{max} >> T_E$ enlarges the Au—Ge drop via Ge absorption from the NW to a diameter of 75 nm, 20% larger than the original wire diameter (~60 nm). When the temperature is lowered the NW re-grows, but with a new diameter ($d_{NW}$~75 nm) defined by the now-larger drop.

Two modifications of the Ge-rich alloy drop at high temperature enable the expansion of the Ge wire: a substantial growth of the drop volume due to incorporation of Ge as evident from the phase diagram, and an adjustment of the Au—Ge/Ge interface. The solid-liquid interface reshapes from a planar Ge (111) facet to a multifaceted interface consisting of a central (111) plane surrounded by {113} facet segments at the periphery. This is illustrated by the dashed lines in FIG. 6A which indicate the projected shape of the interface between the Ge NW and the Au—Ge drop. The central dashed line which is perpendicular to the NW axis represents the (111) plane whereas the two angular lines at the periphery represent {113} facets. The net result is a significantly larger footprint of the Au—Ge drop perpendicular to the wire axis, a prerequisite for the growth of a thicker NW, which is initiated by lowering the temperature, or by changing the composition of the precursor vapor during those syntheses in which a precursor is present. Expansion of the NW diameter upon cooling from 475° C. to solidification at 283°

C. is shown in FIGS. 6A-6C where the curved lines delineate the shape of the Au—Ge alloy drop at 475° C.

As the drop is cooled from 475° C. (FIG. 6A) to 285° C. (FIG. 6B), the drop reduces its Ge content by expelling Ge atoms to the NW. The shape of the newly grown NW section closely follows the original shape of the liquid alloy drop. Experiments on etching and growth have shown that {113} is a fast growing facet for Ge, while incorporation into the (111) plane is much slower. Hence, the initial wire growth from the cooling drop is accommodated almost entirely on the {113} facets, thus supporting the dilation of the NW diameter. Ge is not incorporated into the (111) interface plane until the {113} segments have been outgrown as shown by FIG. 6C which reveals a fully solidified drop at $T_S=283°$ C. The material mediating the expansion of the NW diameter is shown, in FIG. 6D, to be perfectly crystalline Ge, without any observable defects. This Au—Ge nanoparticle and wire underwent a radial dilation of 5.3 nm upon solidification of the Ge NW.

The expansion of the NW diameter depends on the annealing-induced swelling of the VLS alloy drop and on the reshaping of the solid-liquid interface. Control experiments in which these effects were suppressed by limiting the maximum temperature to a few degrees above the melting point, i.e., $T_{max} \approx T_E$, resulted again in NW re-growth due to the melting-crystallization hysteresis, but with the original, smaller wire diameter.

III. Nanostructure Characterization (Metastable Phase)

A pathway to forming nanoscale metastable solids involves the stabilization of the liquid phase and crystallization of an extremely supercooled melt. Liquid AuGe alloy drops at the tips of Ge NWs show pronounced departures from equilibrium during slow cooling, and ultimately crystallize as single-crystalline segments of metastable γ-AuGe, a superconductor in the bulk. It is believed that such crystallization from frustrated liquids may enable harnessing the functional properties of metastable structures in a wide range of nanomaterials.

For liquid AuGe drops at the tips of Ge NWs, a size-dependent depression of the liquidus compared to AuGe bulk alloys gives rise, to very high equilibrium Ge concentrations at relatively low temperatures, at which the Ge NWs remain intact. A linear arrays of Ge NWs with diameters between 30 nm and 70 nm was used, which was defined by nanolithography of Au seeds for vapor-liquid-solid (VLS) growth perpendicular to a Ge (111) substrate, to explore by in-situ transmission electron microscopy (TEM) the behavior of such Ge-rich drops during cooling and crystallization.

Figure 8:
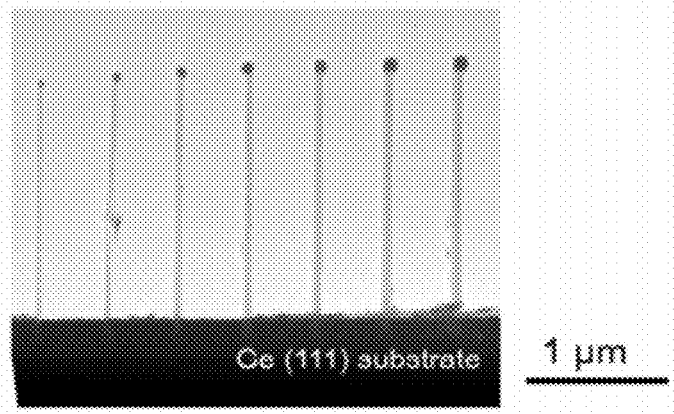
FIG. 8 is a TEM image of a linear array of Ge NWs on the thinned original Ge substrate during the in-situ TEM experiments.

NW array TEM samples were prepared by precision mechanical thinning of the Ge substrate beneath linear arrays of Ge NWs to a thickness of ~5 μm, and then mounted in the high-temperature holder with the nanowire array perpendicular to the incident electron beam. The intact Ge substrate and array geometry ensured a uniform heat distribution and identical conditions, such as temperature, electron beam exposure, etc., for the entire array. The TEM image of FIG. 8 shows such a NW array, supported by the Ge growth substrate. All NWs are monocrystalline with axis along the [111] direction, and have AuGe VLS seeds at their tips.

The AuGe alloy melt drops to high temperatures (up to ~600° C.) were followed by focusing particularly on their behavior during subsequent cooling and crystallization. Variable temperature TEM experiments were carried out in FEI Titan 80-300 Cs-corrected environmental TEM and in a JEOL JEM 2100F field-emission microscope equipped with a Gatan 652 high-temperature sample holder. The temperature ranged between room temperature and 600° C. at pressures below $10^{-7}$ torr for the in-situ experiments. The electron irradiation intensity was kept intentionally low (<0.1 A/cm$^2$) during the observations to prevent any uncontrolled electron beam induced structural changes. The AuGe alloy composition as a function of temperature was quantified from measurements of the drop volume as a function of temperature following the procedure described in Section II. In-situ energy dispersive x-ray spectrometry was used to determine the composition of the different size drops close to the eutectic point, which was assumed to be achieved upon the original melting of the nanoparticles at the tips of the NWs, as well as at room temperature after high temperature annealing.

A. Nanoparticle Alloy Metastable Phase Transition

Initial heating from room temperature to 300° C., where the AuGe particle is still solid, desorbs the thin native oxide from the Ge NW surface. Heating to progressively higher temperatures first leads to surface melting, followed by the melting of the entire particles near the bulk eutectic temperature, $T_E=363°$ C., as the alloy achieves the (eutectic) composition with the lowest melting point by uptake of Ge from the NW. Above 380° C. all alloy particles are liquid. A further increase in temperature to 600° C. ($\gg T_E$) is accompanied by the uptake of large amounts of Ge into the alloy drops, which shifts their composition to Ge contents >50 at. %, with the precise composition.

Figure 9:
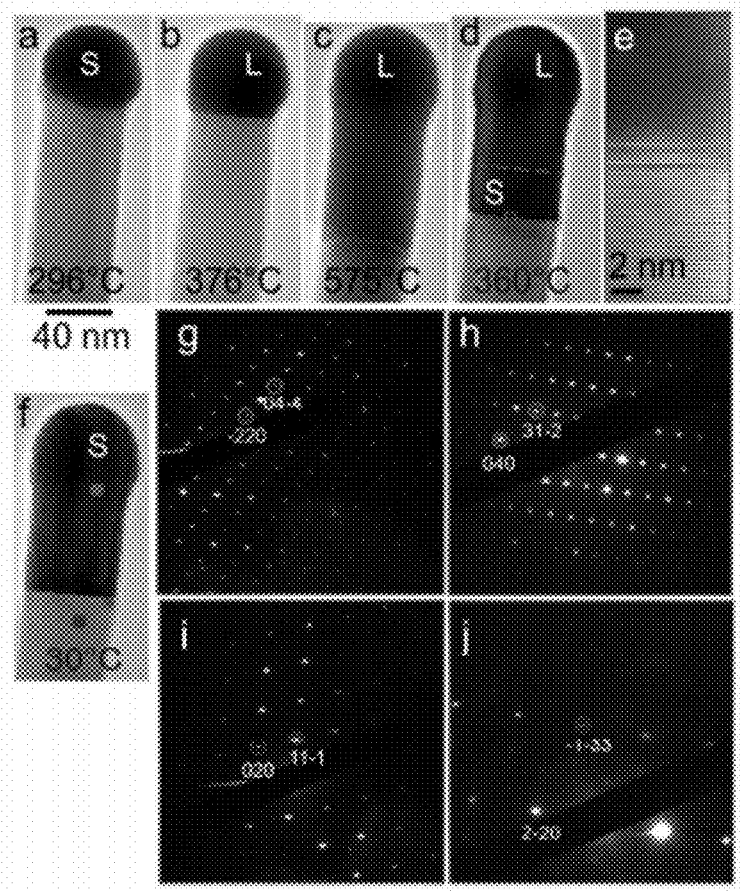
FIGS. 9A-9D and 9F are a sequence of TEM images showing melting, liquid-state evolution, and crystallization of the Au—Ge alloy at the tip of a 54 nm Ge NW during in-situ annealing up to 575° C., followed by cooling to room temperature. In the images, 'L' and 'S' denote liquid and solid states, respectively.
FIG. 9E is a high magnification image of the interface between the Ge NW and the crystalline Au—Ge alloy presented in FIG. 9D.
FIG. 9G-9H are two diffraction patterns from the Au—Ge alloy presented in FIG. 9F along the [111] and [203] zone axes.
FIG. 9I-9J are two diffraction patterns from the Au—Ge alloy presented in FIG. 9F along the [101] and [334] zone axes.
Figures 10, 11A, 11B:
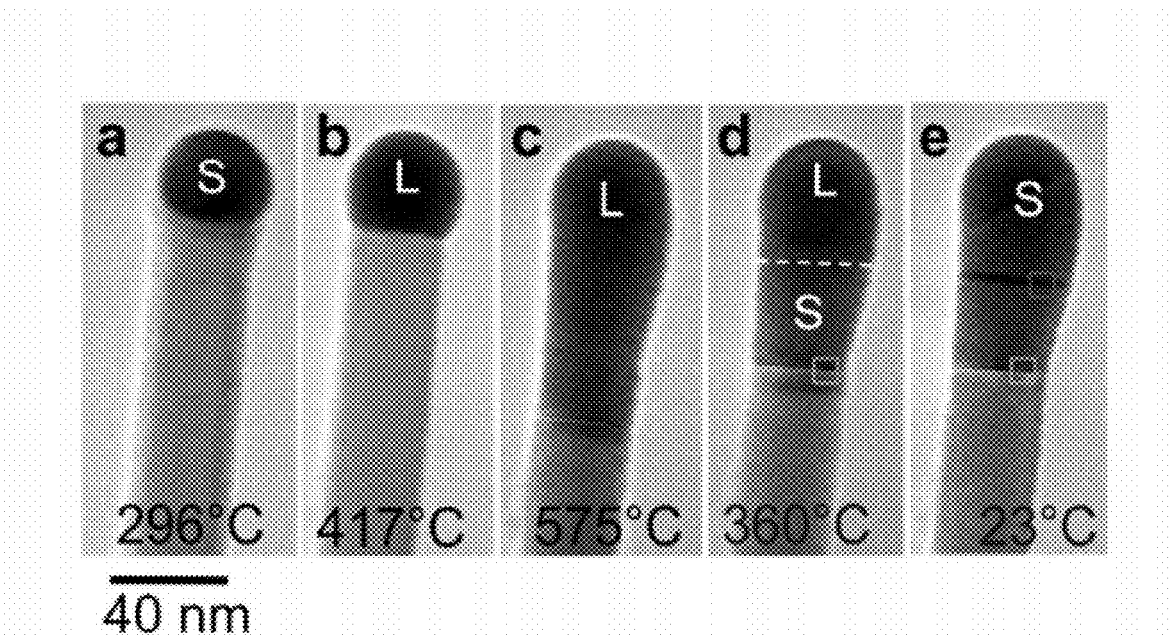
FIG. 11A is a high magnification image of the upper interface marked in FIG. 10E.
FIG. 11B is a high magnification image of the lower interface marked in FIG. 10E.

FIGS. 9A-9C show the evolution of one NW in the linear array of FIG. 8 (diameter 54 nm) during heating from room temperature. With increasing temperature $>T_E$, the Ge content of the liquid AuGe drop increases to a maximum of 68 at. % at 575° C. According to the equilibrium phase diagram (see Section IIB), subsequent slow cooling should reverse the Ge uptake. In particular, it is believed that a reduction in Ge solubility and concomitant Ge supersaturation of the alloy melt should drive the progressive lowering of the Ge content of the drop via phase separation of Ge into the adjacent solid NW. Comparison of FIGS. 9C and 9D shows only a slight reduction of the Ge content of the drop (by 3-4 at. %) upon slow cooling (e.g., ≈5° C./min) from 575° C. to 360° C. Instead of reversing to the eutectic composition (27% at. % Ge), the alloy maintains a very high Ge content (64-65 at. %), even after long (several hours) annealing at 360° C. At the onset of crystallization, a separation into the equilibrium Au and Ge solid phases still does not occur. Instead, only a part of the AuGe alloy tip immediately adjacent to the Ge interface crystallizes initially, while the upper section of the tip remains liquid. FIG. 9E shows the AuGe/Ge interface and part of the crystalline alloy segment, which has an overall length of ~30 nm at this temperature. The crystalline alloy shows a lattice spacing d=0.26 nm, different from $d_{(111)}$ of Ge or any of the possible lattice spacings of fcc Au. Upon further cooling to room temperature, the solidification continues on the already crystalline segment and ultimately encompasses the whole AuGe alloy (see FIG. 9F). During this entire process, neither any further transfer of Ge from the alloy to the NW, nor any other form of Ge phase separation was observed.

Electron diffraction patterns (DPs) from the alloy as well as the adjacent Ge NW were recorded at room temperature immediately following the annealing experiment (see FIG. 9G-9J). Both the high-resolution (BR) imaging and the DP indicate that the alloy segment is single-crystalline without any extended defects. The DP from the alloy phase can be indexed to the metastable γ-phase of AuGe with tetragonal structure, which is described in Ananthar, Tr. et. al. *Nature* 210, 1040-1041 (1966) (incorporated herein by reference in its entirety). The metastable alloy forms a well-defined, sharp interface with the Ge NW. The [01-1] axis of the alloy is aligned with the NW axis, i.e., the [11-1] direction of Ge. Surveying the Ge NWs with different diameters in the disclosed array, and performing several additional in-situ annealing experiments on similar samples, the metastable γ-Au—Ge phase was established to form generally in NWs with diameters below 70 nm and peak Ge content of the liquid alloy above 60 at. % at 600° C. Once formed, the crystalline γ-phase AuGe segment is surprisingly stable. Neither after storage at room temperature for prolonged time periods (several months), nor during re-annealing to temperatures up to $\sim T_E$, were any phase separation or changes in the crystal structure detected.

The size-dependent Ge solubility of alloy drops on Ge NWs was used to assess the behavior of AuGe with even higher Ge content. Drops containing more than 70 at. % Ge at 600° C. exhibit a more complex crystallization and metastable phase formation. FIG. 10A-10D follow the annealing of one such drop on a thinner Ge NW (diameter 32 nm) After melting and upon heating to 575° C. (see FIG. 10A-10C) the interface again receded significantly, but in this NW the alloy absorbed more Ge from the adjacent NW and thus reached ~77 at. % Ge. Similar to the NW in FIG. 9, the slow cooling to 360° C. followed by long annealing resulted in a very limited separation of Ge. Only 6 at. % Ge is expelled from the alloy and becomes reincorporated into the Ge NW. Again, the section of the alloy immediately adjacent to the Ge interface crystallizes first, over a length of 33 nm (marked 'S' in FIG. 10D). The high-resolution TEM image of the interface of this crystalline alloy segment and the Ge NW (FIG. 11G) shows again a lattice spacing of 0.26 nm, consistent with γ-AuGe, but superimposed by a periodic contrast modulation with a larger period of 0.77 nm. (see FIG. 12). Cooling from 360° C. to room temperature induces the further crystallization of the remaining liquid alloy at the tip, but now with the simple γ-AuGe structure as in FIG. 9. The interface between the modulated and simple alloy phases is atomically sharp, as shown in the high-resolution TEM image in FIG. 11F. Z-contrast imaging in scanning TEM mode shows that each of the two alloy segments has homogeneous composition. Energy dispersive x-ray spectrometry shows different amounts of Au in the two parts, evaluated to be ~82 at. % in the modulated phase and ~66 at. % in the simple γ-AuGe phase at the tip.

Figure 15:
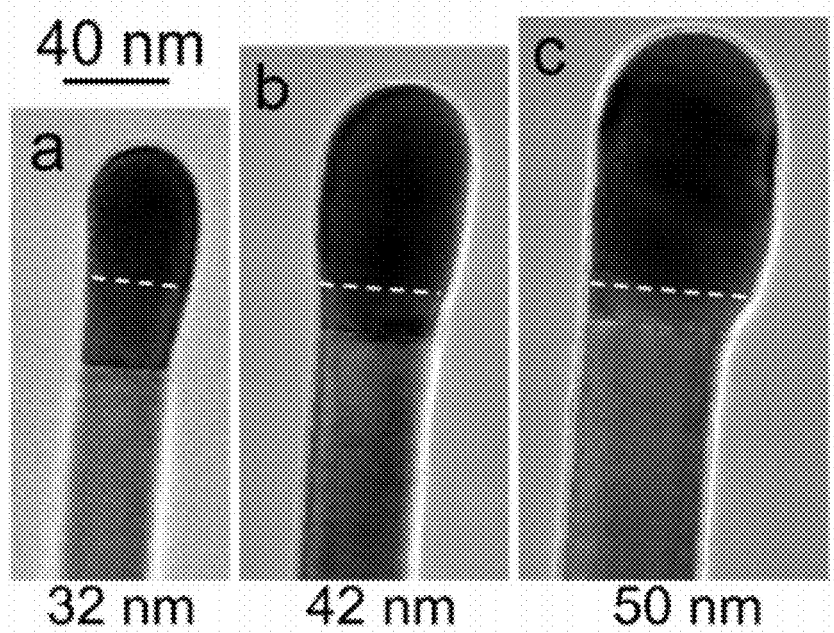
FIG. 15A is an image of the modulated, metastable AuGe segment for 32 nm Ge NW, carrying an AuGe alloy with 76 at. % at Ge at 575° C. Dashed lines mark the interface between modulated and simple γ-AuGe phases.
FIG. 15B is an image of the modulated, metastable AuGe segment for 42 nm Ge NW −73 at. % at Ge at 575° C. Dashed lines mark the interface between modulated and simple γ-AuGe phases.
FIG. 15C is an image of the modulated, metastable AuGe segment for 50 nm Ge NW −70 at. % at Ge at 575° C. Dashed lines mark the interface between modulated and simple γ-AuGe phases.

To corroborate that a spatially modulated γ-AuGe alloy phase forms due to the need to accommodate high Ge concentrations upon crystallization, control experiments were performed with systematically varying composition of the alloy melt, achieved by considering thin Ge NWs with different diameters. (see Section II) The extent of the simple and modulated AuGe phases can be tuned by proper choice of the peak Ge content of the melt (see FIG. 15). To accommodate different overall Ge concentrations, their relative proportions adjust while the compositions of the two solid phases remain fixed.

Figure 12:
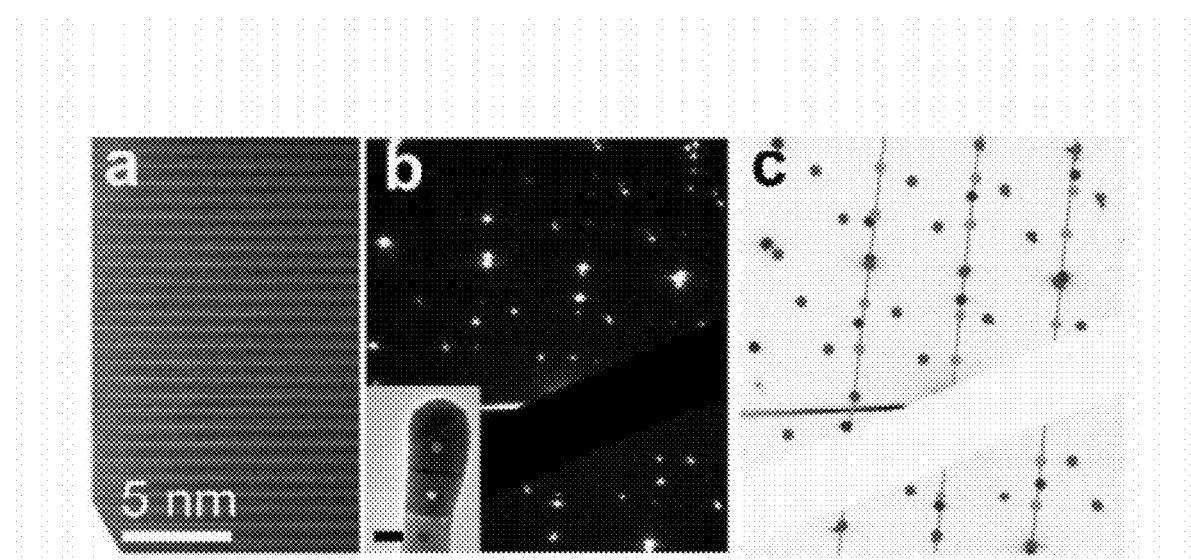
FIG. 12A is a high-resolution TEM image of the Au—Ge alloy superlattice adjacent to the Ge NW.
FIG. 12B is an electron diffraction pattern (DP) of the entire tip segment shown in the inset. Scale marker in inset: 20 nm.
FIG. 12C is an inverted DP from FIG. 11B with superimposed patterns from the Ge NW along the [101] zone axis and the tetragonal γ-Au—Ge structure along the [1-11] zone axis, respectively.
Figure 13:
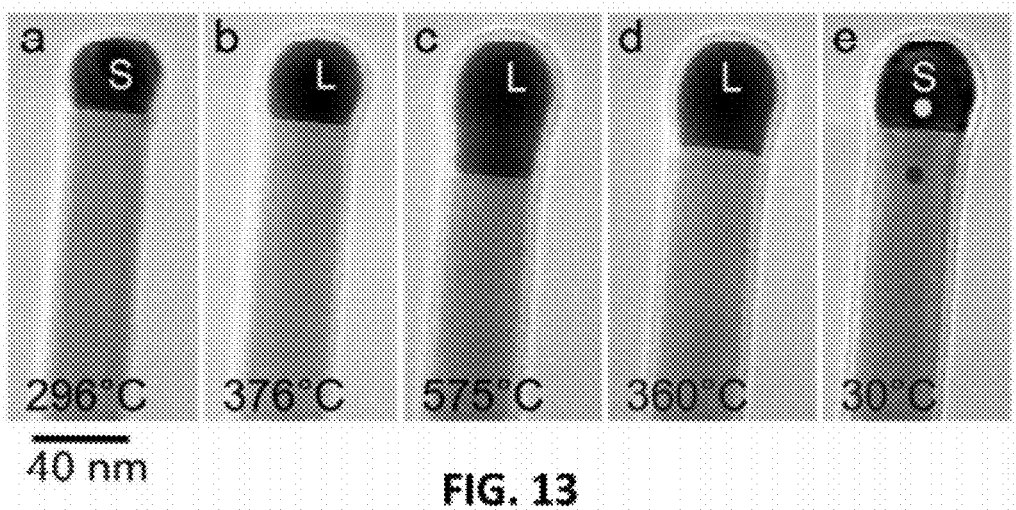
FIG. 13A-13E are a sequence of TEM images showing melting, liquid-state evolution, and crystallization of the Au—Ge alloy at the tip of a 32 nm Ge NW terminated by a C shell during in-situ annealing up to 575° C., followed by cooling to room temperature.
Figure 14A:
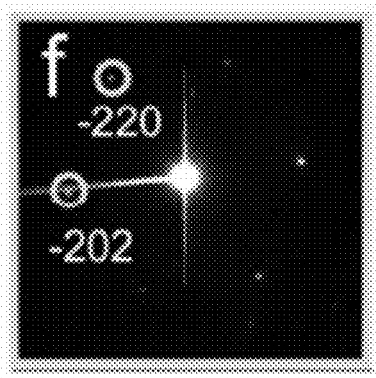
FIG. 14A-14B are the diffraction patterns from the fcc Au nanoparticle at the tip and the diamond cubic Ge NW structure represented in FIG. 13E, respectively.
Figure 14B:
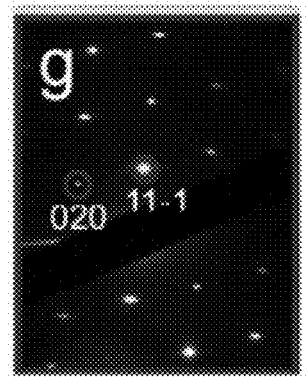

A HRTEM image and DP of the periodically modulated alloy phase forming at the Ge interface are shown in FIG. 12. The HR image clearly shows a modulation with a period of 0.77 nm in addition to the (044) lattice planes (d=0.26 nm) of γ-AuGe. The DP shows a set of reflections unique to the intermediate phase (FIGS. 12B and 12C). These spots appear to be satellite reflections to the diffraction spots of γ-AuGe along [011], which is the direction in which an additional modulation is observed in HRTEM imaging. Thus, it is believed that the AuGe alloy near the Ge interface is a short-period superlattice, based on γ-AuGe but with periodically modulated Ge profile along the NW axis. The superlattice phase is capable of accommodating higher Ge contents than the simple γ-AuGe phase and hence forms spontaneously during the crystallization of very Ge-rich AuGe melts.

B. Phase Formation Under a Carbon Shell

Control experiments demonstrate that (1) the very limited Ge phase separation during cooling of nanoscale, and (2) Ge-rich liquid AuGe alloys and the crystallization of the supersaturated melt in a uniform or periodically modulated metastable γ-AuGe phase, are due to the high peak Ge concentrations reached by the nanoscale alloy, and not due to other factors, such as the particular annealing and cooling protocols employed. According to Sutter, E., et al. *Appl Phys Lett* 90, 093118 (2007), the AuGe liquidus can be tuned by judicious changes in surface termination, e.g., by altering the surface tensions of the solid NW and of the alloy drop by a thin graphitic carbon shell. This C-termination reduces the Ge solubility in the alloy melt compared to unterminated NWs, so that it approaches the (lower) bulk value. FIG. 13A-13E follow the evolution of one such NW (diameter 32 nm, covered by a 5 nm C shell) during annealing to 600° C., followed by cooling to room temperature. As expected the Ge uptake of the alloy is much smaller, and it reaches a Ge concentration of only ~52 at. % at 575° C. Lowering the temperature, the incorporation of Ge in the drop is observed to be completely reversible, i.e., nearly the entire amount of Ge originally incorporated in the alloy drop upon heating to high temperature phase separates and becomes re-incorporated in the Ge NW during slow cooling to room temperature. Following crystallization, the drop has a crystal structure that can be indexed to fcc Au randomly orientated with respect to the adjacent Ge NW. The formation of metastable phases was never observed during the crystallization of drops with Ge content below ~58 at. %, limited by modifying the surface termination, by keeping the annealing temperature low (<475° C. for thin NWs), or by considering NWs with larger diameter (>100 nm).

C. Phase Formation and Equilibrium

Metastable solid phases usually form in processes far from equilibrium. Bulk AuGe alloys in metastable phases—hcp β-AuGe at 17.5-22.5 at % Ge; and bct γ-AuGe at 40-60 at % Ge (Jones, H. *Rep Frog Phys* 36, 1425 (1973); Cavallotti, P. L. et al. *Electrochim Acta* 50, 4557-4565 (2005); Manaila, R. *Phys Status Solidi A* 176, 801-834 (1999); Agarwal, S. C. & Herman, H. *J Mater Sci* 13, 916-919 (1978); Fujinaga, Y. et al. *J Less-Common Met* 170, 277-286 (1991); each incorporated herein by reference in its entirety)—can be isolated by fast ($10^{8\circ}$ C./sec) splat cooling of melts with appropriate Ge contents, by ion mixing, or during thin film deposition. The metastable AuGe bulk or thin film phases are invariably poly- or nanocrystalline and weakly stabilized. In particular, they rapidly transform into the stable phase during mild annealing (<100° C.) (Elliott, R. & Shunk, F. *Journal of Phase Equilibria* 1, 51-54, (1980)). Nevertheless, they have attracted significant interest due to properties, such as superconductivity with a transition temperature up to ~2 K in γ-AuGe.

In the disclosed nanowire geometry, monocrystalline metastable AuGe alloy NW segments are produced by annealing, subsequent slow (near equilibrium) cooling, and crystallization provided that Ge is incorporated to sufficiently high concentrations in the molten AuGe alloy drops at the NW tip. It is believed that the key to understanding this unusual behavior must lie in the properties of Ge-rich liquid AuGe alloy melts. While Section II has identified a large, size-dependent suppression of the liquidus in nanoscale AuGe, which gives rise to equilibrium Ge contents far exceeding those in the bulk, the present results also show that this Ge uptake can be irreversible. The temperature drop from ~600° C. to the crystallization temperature of 360° C. represents a significant supercooling of the AuGe alloy melt. The frustrated liquid ultimately begins to crystallize in a liquid-solid coexistence regime (i.e., a non-equilibrium liquidus), in which the solid is either a uniform metastable γ-Au—Ge phase (for ~60 at. % Ge in the melt) or a compositionally modulated superlattice based on γ-Au—Ge (for >70 at. % Ge in the melt). This departure from equilibrium, which is different from the simple supercooling of eutectic binary alloys observed on NWs, is seen for alloys with Ge contents of 60 at. % or higher for γ-phase (for β-phase lower concentration will be needed), whereas melts with Ge concentration below 50 at. % trace the same (equilibrium) liquidus during heating and cooling. These observations suggest a distinct stabilization of the nanoscale binary alloy melt with high Ge content, and a correspondingly suppressed phase separation upon cooling. X-ray diffraction shows a simple close-packed liquid structure, similar to that of Au, for AuGe melts near the eutectic point (i.e., 28 at. % Ge). With increasing Ge concentration (50 at. % Ge), a clear trend to a more open structure emerges, characteristic of liquid group IVA elements. Splat-cooling of such Ge-rich bulk AuGe melts, which tends to produce crystalline structures templated by the packing in the liquid, results in metastable γ-AuGe, having the same phase crystallized from slowly supercooled AuGe melts on Ge NWs.

D. Phase Formation in Gold/Silicon Alloy

The notion that the underlying liquid-phase structural motifs of the Ge-rich AuGe melt are preserved during supercooling in a nanoscale system, whereas they can only be quenched-in at very high cooling rates in the bulk, indicates a stabilization of these liquid motifs. It has been suggested in Schülli, T. U. et al. (*Nature* 464, 1174-1177) that liquid AuSi alloys can be similarly stabilized by a Si(111) support interface with a particular atomic structure, so as to reach unusual degrees of supercooling prior to crystallization. To explore these similarities further, experiments analogous to those shown in FIGS. 9 and 10 were performed using Au-tipped Si NWs. The overall findings are the same as for AuGe. In particular, the cooling of Si-rich (~75 at. %) AuSi drops from 750° C. does not induce Si phase separation and re-growth of the Si NW, but the alloy melt retains nearly its entire peak Si content. When it ultimately solidifies, the alloy still does not phase separate but instead transforms into an amorphous AuSi segment at the tip of the NW.

IV. Exemplary Embodiment

The in situ experimental results presented in this specification demonstrate that consideration of the actual phase diagram of a nanoscale VLS seed drop can be used to judiciously tailor the geometry of a growing NW. A junction where the NW diameter increases over a section of few nanometers is achieved by controlled expansion of the Au—Ge drop, following the liquidus of the nano-drop phase diagram. In practice, this entails absorption of additional semiconductor from the precursor or the NW into the alloy drop to expand to a new, larger wire diameter. This may be accomplished by increasing the temperature with or without an interruption of the growth, and/or annealing at higher temperatures. Further VLS NW growth under the new conditions will maintain the larger diameter of the wire. Experimental results show that even moderate annealing temperatures above the eutectic point provide a substantial potential for tailoring the NW geometry whereas a negligible effect would be predicted by the bulk phase diagram.

FIG. 7 is a schematic illustration of an exemplary nanostructure made in accordance with the present invention. The first nanowire segment 10 exhibits a taper 20 that is abrupt on an atomic scale, occurring over the length of a few lattice constants of the nanowire material. A second nanowire segment 30 results from an increase in the volume of the seed droplet 40. As the process of increasing the volume of the seed droplet is repeated, several segments of the nanowire, each having a different diameter, may be fabricated. In certain circumstances, no segment need have a constant diameter, but the taper 20 may be extended indefinitely to provide a nanowire of smoothly increasing diameter.

It is to be understood that localized control of the NW diameter as described in this specification is not limited to VLS growth of Ge nanowires via an Au nanoparticle. Such site-specific control may be attained in any other suitable material system, including other group IV, III-V, II-VI semiconductors and oxides as previously indicated above. Nanoparticles other than Au, e.g., any metal or metal alloy, may be used to form a suitable binary or higher-degree alloy in which the nanoscale phase diagram exhibits a liquidus line wherein the concentration of the NW material in the drop changes appreciably with temperature. The observed solubility change need only be of sufficient magnitude such that the drop size increases by incorporation of NW material in an amount on par with the required increase in NW diameter.

The present NWs are not limited to the structure illustrated in FIG. 7, but also extend to more complex geometries. For example, the NW diameter may be increased a plurality of times in succession to produce a cone-like structure in which the diameter increases or decreases sequentially from one segment to the next. The diameter of a segment may be greater or smaller than that of the preceding or subsequent adjacent segment. The changes in diameter also are not limited to a single nanowire, but may be simultaneously applied to a plurality of nanowires arrayed on a substrate by controlling the temperature of the entire surface.

The change in geometry may be accompanied by a change in doping of the nanowire. For example, when the nanowire diameter is increased by incorporation of growth precursor at higher temperature, the simultaneous introduction of dopant precursor will result in doping of the enlarged section of the nanowire. Of course, doping type and/or concentration may be changed abruptly or continuously along the NW at locations other than segment interfaces.

V. Electronic Devices

Since quantum size effects and surface processes are associated with the size of the particle and the ratio of atoms at the surface to those in the bulk volume, control of material properties influenced by these two factors may be imparted by localized dimensional control of NW diameters. Consequently, a plurality of electronic devices which exploit this property may be fabricated. (See, for example, an enumeration supra.)

The abrupt change in nanowire diameter between segments results in an abrupt change in the bandgap of the nanowire at the segment interface. This creates an electronic junction between the segments, located at the physical interface. Such a junction mimics, for example, a Si—Ge or GaAs—InAs heterojunction wherein the wider bandgap (narrower diameter) NW segment is analogous to the Si or GaAs material, and the smaller bandgap (larger diameter) NW segment is analogous to the Ge or InAs material. It will be appreciated by those in the art that any electronic device or structure that depends on the discontinuity of bandgaps at heterojunctions can in principle be made using the present segmented NWs.

Furthermore, a three-segment NW in which the first and third segments have a higher bandgap than the intervening second segment mimics a quantum well structure in which carriers are confined to the smaller-bandgap segment at equilibrium. In addition, combinations of geometry and doping profile can be used to create complex structures and devices using the methods described herein.

It will be appreciated by persons skilled in the art that the present invention is not limited to what has been particularly shown and described hereinabove. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. That alternate embodiments may not have been presented for a specific portion of the invention, and may result from a different combination of described portions, or that other not described alternate embodiments may be available for a portion, is not to be considered a disclaimer of those alternate embodiments. It will be appreciated that many of those not described embodiments are within the literal scope of the following claims, and others are equivalent.

The invention claimed is:

1. A nanowire comprising
a first section and a second section adjacent to the first section wherein the nanowire in the first section has a metastable phase and the nanowire in the second section has a stable phase, and wherein the metastable phase comprises a metastable semiconductor or metallic alloy.

2. The nanowire of claim 1, wherein the metastable semiconductor is selected from the elements of group IV, III-V, and II-VI.

3. The nanowire of claim 2, wherein the alloy comprises a binary, ternary, quaternary, or higher-degree alloy.

4. The nanowire of claim 3, wherein the alloy comprises an alloy of gold (Au) and germanium (Ge).

5. The nanowire of claim 4, wherein the alloy is a single-crystalline metastable γ-AuGe or β-AuGe.

6. A superconductor comprising the nanowire according to claim 1.

7. A method of forming metastable nanowire during growth of the nanowire, the method comprising:
growing a nanowire;
forming a liquid drop at a growing tip of the nanowire;
stabilizing the liquid drop;
slow near equilibrium cooling of the liquid drop; and
crystallizing the cooled liquid drop to form the metastable nanowire.

8. The method of claim 7 wherein the slow near equilibrium cooling comprises cooling at the rate of no greater than about 5° C./minute.

9. The method of claim 7, wherein the liquid drop departs from an equilibrium and phase separates during cooling.

10. The method of claim 7, wherein the liquid drop comprises a molten binary, ternary, quaternary, or higher-degree alloy made from the elements of group IV, III-V, and II-VI.

11. The method of claim 7, wherein the liquid drop comprises a molten AuGe alloy.

12. The method of claim 11, wherein crystallization comprises incorporating a sufficiently high concentration of Ge in the molten AuGe alloy.

13. The method of claim 12, wherein the sufficiently high concentration of Ge is about 60 at. % or higher for a γ-AuGe.

14. The method of claim 13, wherein an uptake of Ge is irreversible.

15. The method of claim 7, wherein a temperature drops from about 600° C. to about 360° C. during slow near equilibrium cooling.

16. The method of claim 7, wherein the growth of the nanowire is done by the VLS method.

* * * * *